United States Patent [19]

Dampier et al.

[11] Patent Number: 4,928,061
[45] Date of Patent: May 22, 1990

[54] MULTI-LAYER PRINTED CIRCUIT BOARD

[75] Inventors: Michael S. Dampier, Burlington; Ronald J. Prilik, South Burlington; Norman R. Rapoport, Williston, all of Vt.

[73] Assignee: International Business Machines Corporation, Armonk, N.Y.

[21] Appl. No.: 330,293

[22] Filed: Mar. 29, 1989

[51] Int. Cl.$^5$ .................. G01R 31/02; H05K 1/11
[52] U.S. Cl. .................... 324/158 F; 361/414
[58] Field of Search ........... 324/158 F, 158 P, 73 PC; 361/414, 309; 174/250, 261, 262

[56] References Cited

U.S. PATENT DOCUMENTS

| | | | |
|---|---|---|---|
| 2,816,273 | 12/1957 | Peck | 333/23 |
| 4,183,074 | 1/1980 | Wallace | 361/402 |
| 4,311,979 | 1/1982 | Graul | 336/205 |
| 4,628,406 | 12/1986 | Smith et al. | 361/414 |
| 4,628,411 | 12/1986 | Balderes et al. | 361/414 |
| 4,675,789 | 6/1987 | Kuwabara et al. | 361/414 |
| 4,734,825 | 3/1988 | Peterson | 361/414 |

Primary Examiner—Ernest F. Karlsen

[57] ABSTRACT

A printed circuit board especially for use in device testing apparatus is provided. The circuit board includes a plurality of stacked layers of dielectric or insulating material with each of the layers having coated on one surface thereof a layer of conducting material defining a plane. The conducting material extends to at least one outer edge of the stack of the material for each plane and at each plane it is spaced with respect to the outer edge locations of all of the other planes. A plurality of lands extend vertically along the stack of material, each land while extending the entire length, only contacting the plane of conducting material extending to the edge at the location of the land whereby a signal applied to any given land is conducted only on the planes where that plane extends to the surface. The configuration for a testing device preferably is an annular configuration and the planes of conducting material extend to both the inner and outer surfaces and signals are applied to the outer surface from an external source and delivered to the test piece from the inner surface.

7 Claims, 5 Drawing Sheets

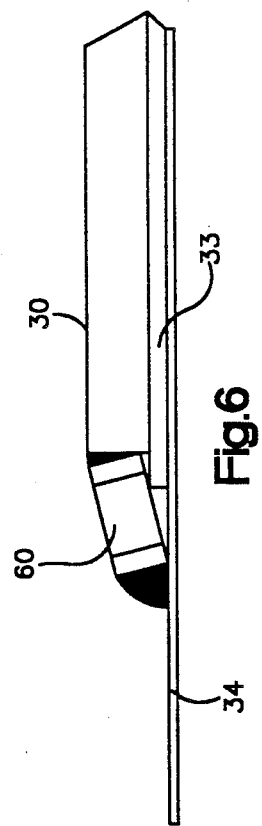
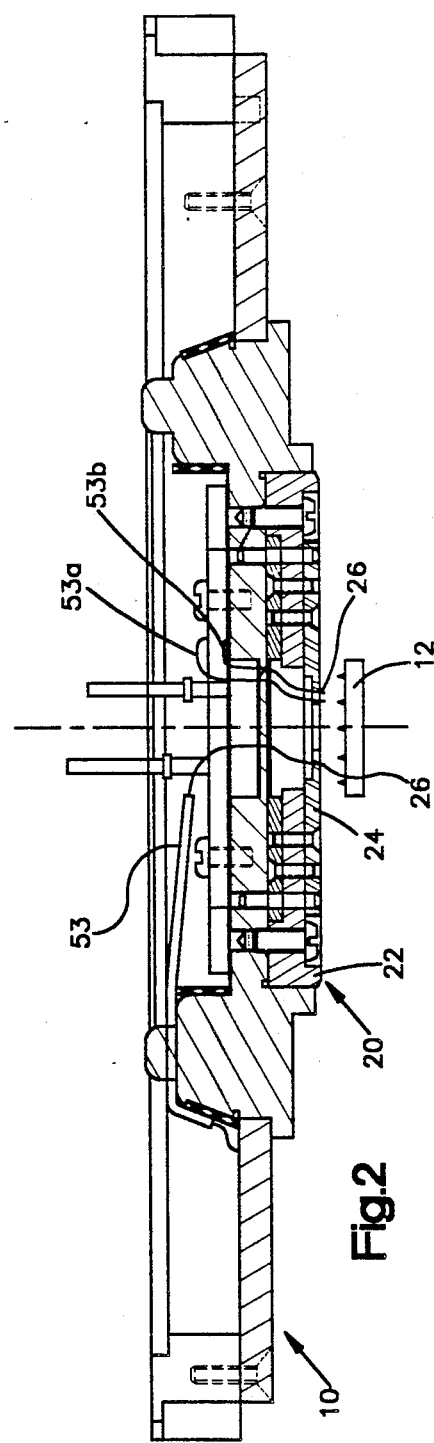

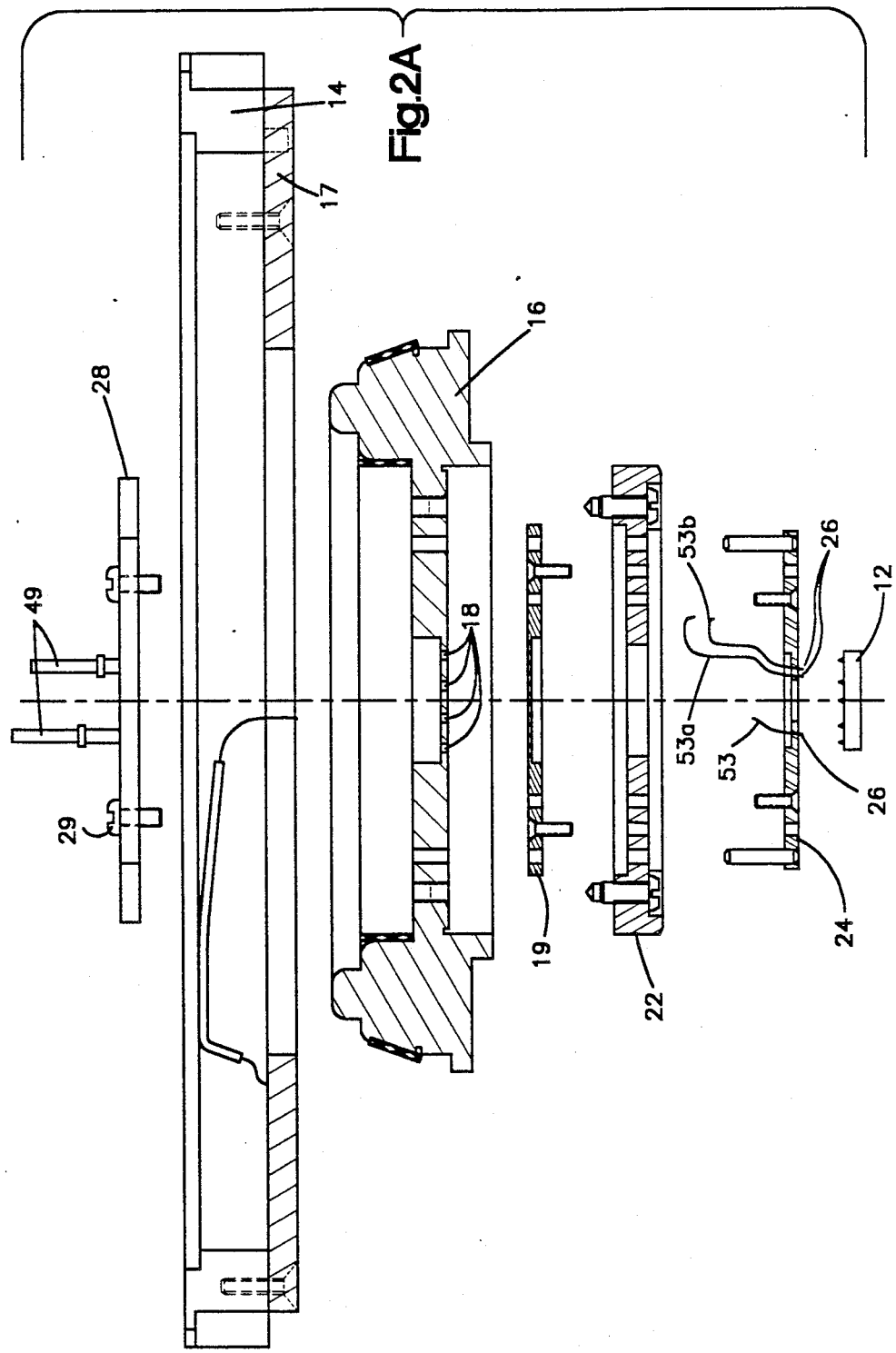

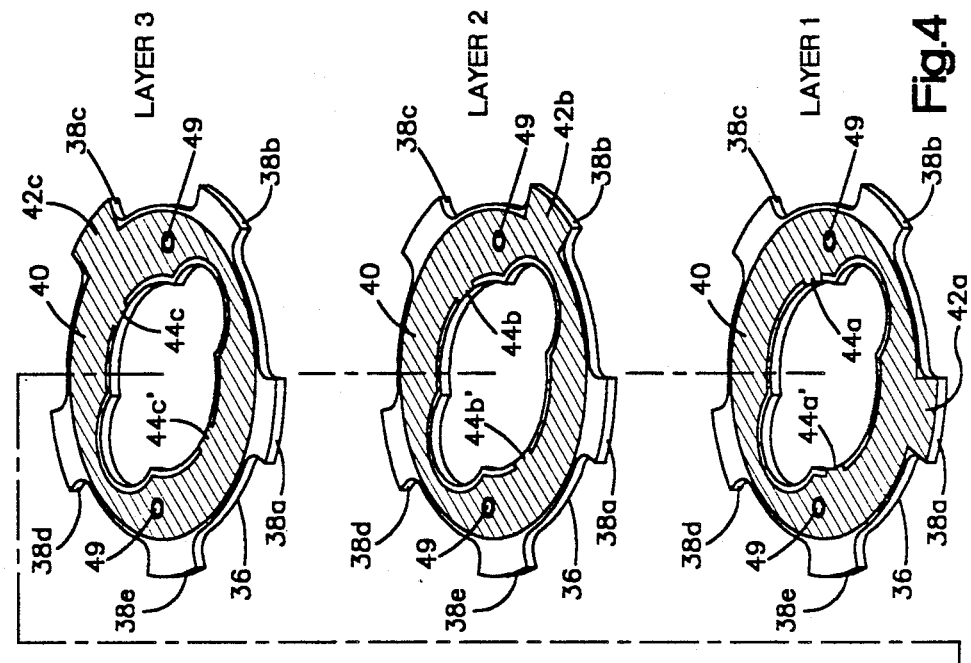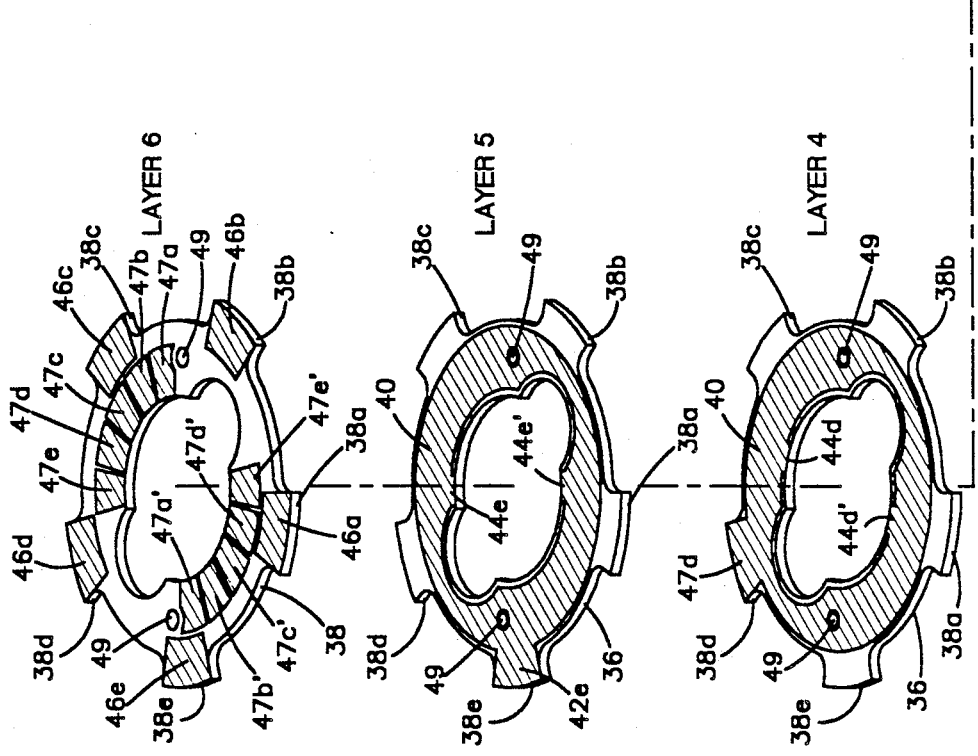
Fig.4

MULTI-LAYER PRINTED CIRCUIT BOARD

BACKGROUND OF THE INVENTION

1. Field of the Invention

This invention relates generally to multi-layer printed circuit boards and more particularly to multi-layer circuit boards which are especially adapted for use in devices for testing integrated circuit chips.

2. Background of the Invention

Following the production of integrated circuit chips, it is necessary to test the chips individually to determined if indeed the chips are satisfactorily manufactured without defects or if there are defects or failures within the chips. This requires the application of signals to all of the chip input terminals, the signals being preprogrammed or preselected to provide a certain pattern of testing of the various devices within the chip through each of the signal input ports. In the case of so called flip chip type integrated circuit chips, the input ports are located across the surface thereof and not around the edge as is generally the case of DIP wire bond type chip technology and the testing apparatus must be supplied which will provide signal inputs to all of the various input ports on the so called chip "footprint".

Devices have been developed which utilize various typed of buckling beam probes mounted on a support member and connected through some type of external signal generator and programmer. The chip testing device requires that wiring that is connected to the external source of the signals be wired through the circuit board which in turn makes contact with the buckling beam probe to provide the necessary signals. It is necessary for signals at various different levels in addition to ground level be applied to the various different inputs of the chip since the chip itself normally will have several different signal levels as inputs when it is in operation. The challenge is to provide a printed circuit board, sometimes referred to as a probe space transform, that will receive the various signal levels and then apply the various received signal levels to the chip, each signal level being applied to the proper input pad on a given chip. Indeed as many as five or more different voltage levels may be required on any given chip, and each voltage connection must be applied to all of the various pads requiring that connection but not to any others.

One of the difficulties encountered with a printed circuit board which serves as the space transform is to provide a board design and manufacturing technique which will allow the voltage to be accurately received from the external source of the signals and accurately applied to the desired chip input pad locations. There have been many different types of circuit board designs which can receive and transform signals. Representative of printed circuit boards or the like are shown in U.S. Pat. Nos. 2,816,273; 4,311,979. U.S. Pat. No. 4,027,935 shows generally how a buckling beam probe can be used to supply test signals to a dip.

SUMMARY OF THE INVENTION

According to the present invention a multi-layer printed circuit board is provided which is especially useful in semiconductor device testing apparatus. The circuit board includes a stack of alternating insulating dielectric layers and metal planes with each of the metal planes being interposed between a pair of the insulating layers. Each of the planes is of a configuration generally smaller than each of the layers on either side of said plane and characterized by a region extending to at least one edge of said layer. Each of said planes having said region extending to the edges of the layers at a position different from that of any other plane. Conductor means are provided extending from the edge of each said region vertically from said plane to the surface of the uppermost insulating layer of the stack.

DESCRIPTION OF THE DRAWING

FIG. 2 is a sectional view taken substantially along the plane designated by the Line 2—2 of FIG. 1;

FIG. 2a is an exploded view of the device shown in FIG. 2;

FIG. 4 is an exploded view of various layers of the printed circuit board utilized in the transform unit;

FIG. 6 is a detail view showing a capacitor connection between the ground plate and the circuit board.

DESCRIPTION OF THE PREFERRED EMBODIMENT

Figure 1:
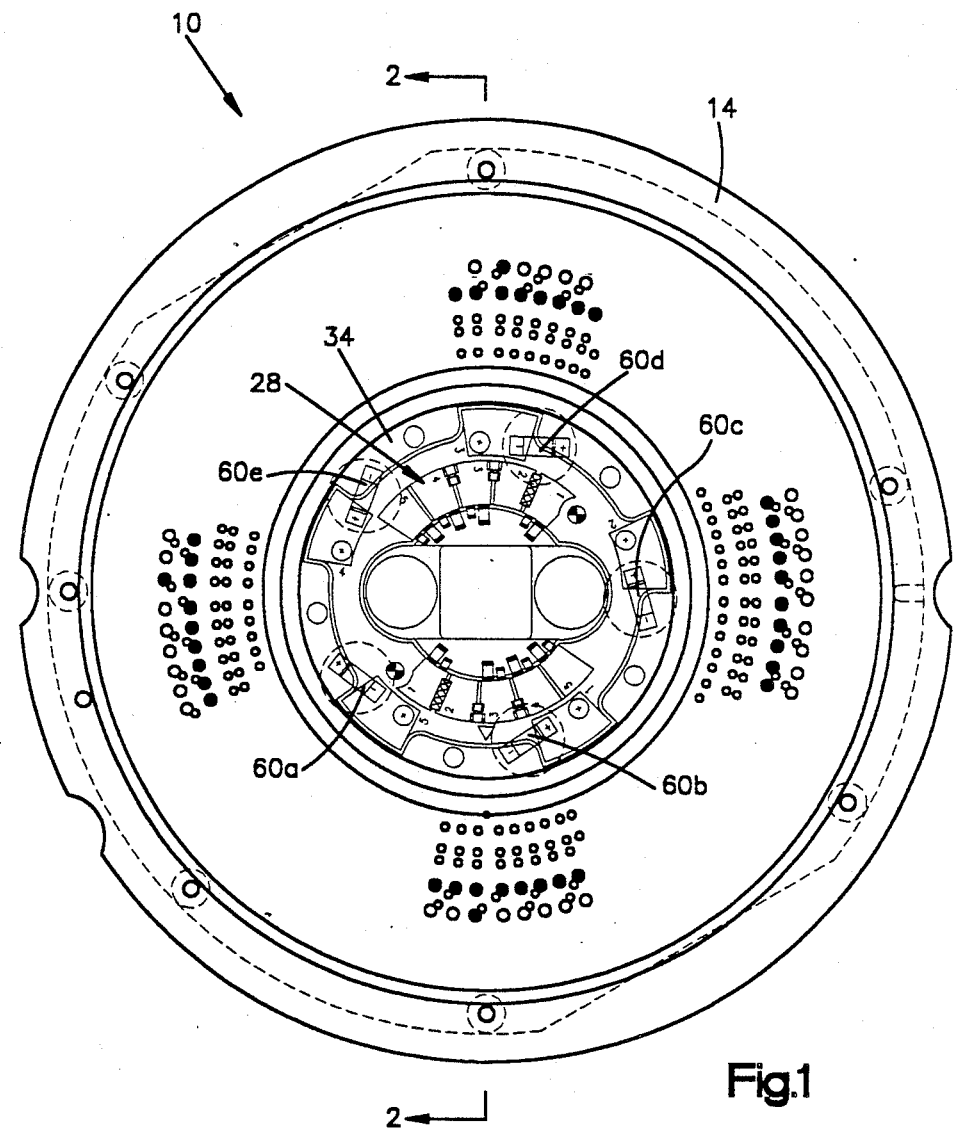
FIG. 1 is a plan view of a testing device incorporating a printed circuit board as a probe space transform according to the present invention.

Referring now to the drawing and for the present to FIGS. 1, 2 and 2a, a chip testing apparatus 10 is shown incorporating the space transform of the present invention. The circuitry and construction of the testing apparatus 10 is fairly complex and detailed but since it does not per se form a part of the present invention, it will be described only very generally with specific reference being only to those portions which interface with the space transform which is the subject matter of the present invention. Also, to this end much of the circuitry and other design detail has been omitted from the drawing for clarity of illustration since these do not form a part of the invention per se.

The chip testing apparatus 10 is utilized to test integrated circuit (I/C) chips one of which is shown at 12 in FIGS. 2 and 2a. The testing apparatus 10 includes an annular supporting ring 14 which mounts a space transform die 16 which is secured to the inner periphery of the supporting printed circuit card 17. The space transform die 16 includes electrical connectors 18 extending through the central portion thereof which are arranged in the pattern of the footprint on the chip to be tested. The electrical connectors 18 interface through upper contactor die 19 with a housing assembly 20 which is secured to the space transform die 16 by means of screws. The housing assembly 20 has a support frame 22 which supports the buckling beam lower die 24. The buckling beam lower die 24 in turn mounts buckling beams 26 which are positioned and arranged to contact the various input connections of the I/C chip 12.

The signals are provided to the buckling beam lower die 24 through the electrical connectors 18 from a multi-layer printed circuit board assembly 28. Multi-layer printed circuit board assembly 28 is secured to the space transform die 16 by means of screws 29. As can best been seen in FIGS. 3 through 5, the assembly 28 includes a multi-layer printed circuit board 30 generally annular in shape and having an internal peripheral surface 31 and an external peripheral surface 32, an insulator 33 and a ground plate 34 all arranged in stacked superimposed relationship. The insulator 33 serves to insulate the multi-layer circuit board 30 from the ground plate 34.

The multi-layer circuit board 30 is comprised of multiple layers of dielectric disks 36 arranged in superimposed relationship, the structure of each of the disks being shown in FIG. 4 in exploded form. The multi-layer PC board 30 in this embodiment is made up of six layers of superimposed dielectric disks 36 each layer having a distinctively formed pattern of conductive material plated thereon as will be described presently. Each of the disks 36, however, is identical and differs only in the pattern of electrical conductors plated on each of the disk layers. The pattern plated on each of the layers will be described in some detail since it is this pattern of plating and the electrical connection which it provides which constitutes the present invention.

Each of the disks 36 has five tabs 38a through 38e circumferentially spaced thereon. On layer 1 conductive plating 40 is applied generally to the center of the disk and on the tab 38a as shown at 42a and extends up to the edge of the tab 38a which defines a plane of conductive material. There is no plating on the tabs 38b, 38c, 38d or 38e of layer 1. Also, the conductive plating 40 on layer 1 is spaced from the inner periphery 31 and does not extend to the inner edge except at two spaced locations or bulges 44a and 44a'. Thus, the conductive metal 40 plated on layer 1 provides a continuous path which is spaced at all points from the outer edge 32 except for the plating 42a on the tab 38a and is spaced at all positions along the inner edge 31 except for those portions 44a and 44a' which extend to the inner edge.

In layer 2 the conductive metal 40 is plated similarly onto the top of the disk 36 but has a portion 42b extending to the outer periphery on the tab 38b. Similarly there are a pair of internal bulges 44b and 44b'. These bulges 44b and 44b'are circumferentially spaced from the location of the bulges 44a and 44a' on the first layer of the dielectric material.

In each of the layers 3 through 5 there are also plating of electrical conductive material 40 in a similar fashion but with the tabs being plated at 42c on tab 38c, plated at 42d on tab 38d, and 42e on tab 38e respectively and with spaced bulges 44c and 44c' through 44e and 44e'. Thus, when the layers 1 through 5 are arranged in a superimposed relationship stacked one upon another with their tabs 38a, 38b, 38c, 38d and 38e in alignment, each of the layers of dielectric material 40 will have a conductive layer extending to the edge of one of the tabs, each tab being a different one of the tabs. Also, each of the layers of dielectric material 40 will have two internal bulges 44a and 44a' through 44e and 44e' which are circumferentially spaced with respect to the other internal bulges extending to the edges of each of the other layers.

Layer 6 which is the top layer has plating with a different configuration from that of layers 1 through 5. Layer 6 has discrete pads of conductive material 46a through 46e deposited on the tabs 38a through 38e thereof and electrically insulated from one another. Also, the top of layer 6 has a series of discrete metal pads 47a and 47a, through 47e and 44e', which align respectively with the bulges 44a and 44a, through 44e and 44e' on layers 1 through 5. Pads 47a and 47a' through 47e and 47e' are deposited discretely on the surface of layer 6 and are electrically insulated from one another and extend to the inner periphery 31 of the disk.

The six dielectric disks 36 with the conductive layers plated thereon are formed in a stacked superimposed relationship with their orientation being provided by locating holes 49 formed therein which allows them to each be precisely indexed with respect to each other. This is the configuration shown in FIGS. 3 and 5. In this configuration, external lands 50a through 50e are plated on the external surfaces of the tabs 38a through 38e of the dielectric rings. Lands 50a through 50e will be in electrical contact with the conductive material 46a through 46e respectively around the upper surface of the dielectric ring 36 on layer six. Similarly internal lands 52a and 52a, through 52e and 52e' are plated on the inner periphery which correspond in location to the inner pads 47a and 47a' through 47e and 47e'.

Figure 3:
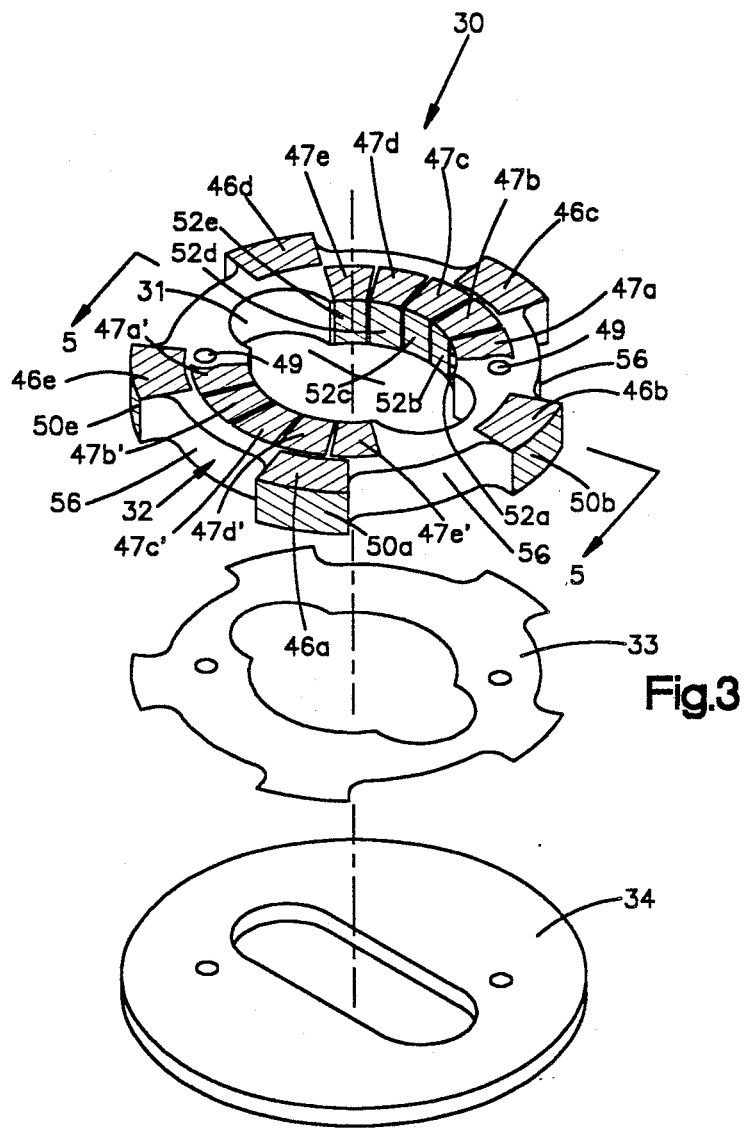
FIG. 3 is an exploded view of the space transform unit utilized in the device of FIGS. 1 and 2.
Figure 5:
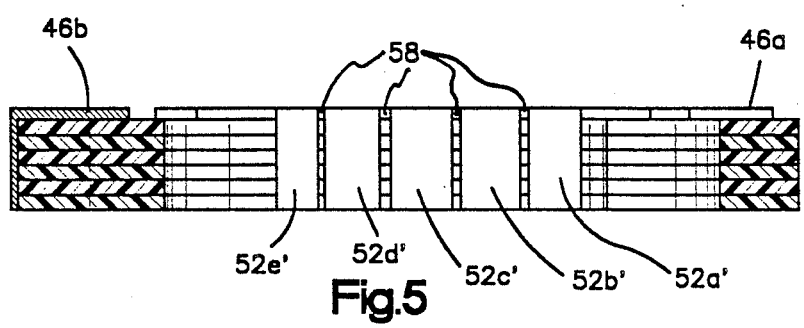
FIG. 5 , is a sectional view taken substantially along the plane designated by the Line 5—5 in FIG. 3.

It can thus be seen that with this configuration as shown in FIGS. 3 and 5 that although the land 50a is in contact with all of the tabs 38a on each of the layers, the only conducting material 40 that this land 50a contacts is that which extends to the outer surface of the tab 38a on the first layer and does not make contact with any of the other conductive materials on layers 2, 3, 4 or 5. Similarly, the land 50b on the outer surface of the tab 38b electrically contacts only the conducting material on tab 38b in layer 2, and so forth with respect to layers 3, 4 and 5.

In similar fashion internal land 52a while extending the entire length of the inner periphery of the stack contacts only the bulge 44a on layer 1, land 52a' contacts only the bulge 44a' on layer 1, and neither is in electric contact with any of the other conductive material 40 on the other layers. This is also true with respect to lands 52b and 52b' through 52e and 52e'.

Hence it can be seen with this configuration a voltage applied to pad 46a will be conducted only to pads 47a and 47a' through land 50a, through plated material 42a on layer 1, through layers 44a and 44a' on layer 1, through lands 52a and 52a'. A voltage applied to pad 46b will be conducted only to pads 47b and 47b', etc. The voltage from pads 47a and 47a' through 47e and 47e' can then be conducted through circuitry, not shown, to the various buckling beams 26. Thus, a very convenient interconnection is provided between the planes of conducting material on various layers in a multi-layer printed circuit board without the need of drilling vias or openings through the stacked configuration, all of the connections being made externally of the stack. This eliminates a great many electrical problems that can develop by having vias or drilled interconnections between layers and provides a very convenient way for transforming a voltage which is applied to the pads 46a through 46e, to an output connection at pads 47a and 47a' which will then be delivered to the chip. Insulator 33 and ground plate 34 each have holes (unnumbered) to align with holes 49 in the stack. The external connections to the pads 46a through 46e as well as other connections are shown very diagrammatically in FIG. 2 and 2a. Connector 53 serves as a signal connection, connector 53a serves as a voltage connection, and connector 53b serves as a ground connection.

In the actual construction of the printed circuit board assembly, the preferred technique for forming the structure is as follows: The various disks 36 of each layer are formed with a circular outer peripheral surface 32 and an internal peripheral surface 31 of the configuration shown. The necessary plating is performed and the disks stacked to form the structure 28. Thereafter, both the internal and external peripheral surfaces 31 and 32 are plated with the material which will form the lands 50a through 45e, 52a through 52e and 52a' through 52e'. Then, to assure complete separation of the lands, the outer peripheral surface is milled to provide grooves 56 between each of the adjacent lands 50a through 50e. Similarly, the internal peripheral surface is milled with grooves 58 between each of the adjacent lands 52a through 52e and 52a' through 52e'. This will assure electrical separation of the lands irrespective of whether the plating fills in these areas.

In order to complete the construction, multi-layer printed circuit board assembly 28 as indicated above includes insulator 33 and a ground plate 34 to provide the required grounding of the chip. In order to achieve capacitive decoupling between the multi-layer PC board 30 and the ground plate 34, a series of capacitors 60a, 60b, 60c, 60d and 60e are interposed between the pads 46a through 46e respectively and the ground plate 34 is shown in FIG. 1. Additional capacitors innerconnected between the pads 47a and 47a' through 47e and 47e' to the ground plate can be used if desired. A connection between one of the capacitors 60 and the ground plate 34 is shown in FIG. 6.

While one embodiment of this invention has been shown and described, many adaptations and modifications can be made without departing from the scope of the invention as defined in the appended claims.

What is claimed is:

1. A multi-layer printed circuit board comprising a stack of dielectric members having at least one exposed face,
    electrical conducting means formed on at least one surface of each dielectric member and predominately spaced from the edge thereof,
    at least first and second portions of the electrical conducting means on each member extending to at least first and second locations respectively at the edge thereof,
    said portions of said electrical conducting means which extend to said edge on at least two of said dielectric members being at locations spaced from each other along the edge,
    at least first and second conducting lands, one for each edge location whereat there is a conductor, disposed on the edge of the stack, and at least first and second pads formed on an exposed face of said stack, each connected to a first group of lands,
    whereby electrical connection to each of the lands will provide electrical continuity to those and only those conductors extending to the edge at the location of the given lands.

2. The invention as defined in claim 1 wherein there are first and second sets of conducting lands corresponding to the first and second portions respectively of said conducting means,
    whereby a voltage applied to any one of said first set of lands will be transmitted to said one of said second set of lands which corresponds thereto.

3. A multi-layer printed circuit board useful in a space transform device for testing semiconductor chips, wherein external signals are supplied to the chip for testing purposes,
    said printed circuit board comprising,
    a stack of dielectric members generally annular in shape and having a inner peripheral edge and an outer peripheral edge,
    each of said dielectric members having a conducting member on one side thereof generally spaced from both peripheral edges,
    each of said conducting members having a first portion extending to the outer peripheral edge at a given location and a second portion extending to an inner peripheral edge at a given location;
    the positions of the electrical conductor at both the inner and outer peripheral edges of at least two of said dielectric members being spaced from each other along both of the peripheral edges,
    a first plurality of conducting lands one for each location wherein there is a first portion of a conductor disposed along the outer peripheral edge,
    and a second plurality of conducting lands, one for each location where there is a second portion of a conductor disposed along the inner peripheral edge of the stack,
    whereby a signal applied to any land is conducted to the associated peripheral edge of only those conductor portions at those associated peripheral edges.

4. The invention as defined in claim 3 further characterized by a ground plate electrically insulated from said stack, adapted to provide a ground voltage to the chips being tested.

5. The invention as defined in claim 4 further characterized by capacitor means connected between at least one conductor and the ground plate.

6. The invention as defined in claim 3 wherein the dielectric members are formed with a plurality of tabs around their outer peripheral edges,
    and wherein said first portion of said conductor member is disposed at the edge of one of said tabs.

7. The invention as defined in claim 3 wherein a first plurality of pads are formed on an exposed surface of said stack each connected to one of said first group of lands, and
    a second plurality of pads are formed on said exposed surface each connected to said second group of lands.

* * * * *